(12) United States Patent
Balzer (10) Patent No.: US 7,107,503 B2
(45) Date of Patent: Sep. 12, 2006

(54) BOUNDARY SCAN WITH GROUND BOUNCE RECOVERY

(75) Inventor: Raymond John Balzer, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 520 days.

(21) Appl. No.: 10/078,883

(22) Filed: Feb. 19, 2002

(65) Prior Publication Data

US 2003/0159096 A1 Aug. 21, 2003

(51) Int. Cl.
*G01R 31/28* (2006.01)
*G06F 11/00* (2006.01)

(52) U.S. Cl. ............................................. 714/727; 714/2
(58) Field of Classification Search ................ 714/726, 714/724, 727, 2, 15, 21
See application file for complete search history.

(56) References Cited

U.S. PATENT DOCUMENTS

| | | | | |
|---|---|---|---|---|
| 6,000,050 A | * | 12/1999 | Komoda et al. | 714/724 |
| 6,012,155 A | * | 1/2000 | Beausang et al. | 714/727 |
| 6,243,843 B1 | * | 6/2001 | Parker et al. | 714/726 |

\* cited by examiner

*Primary Examiner*—Guy Lamarre
*Assistant Examiner*—John P. Trimmings (57) ABSTRACT

A system for recovering from ground bounce during a boundary scan test is disclosed that includes operationally transitioning a Test Access Port controller from any of at least three undetermined controller states induced by the ground bounce to a determined controller state. The undetermined controller states may be selected from an UPDATE state, a RUN-TEST/IDLE state, a SELECT-DR-SCAN state, and a CAPTURE-DR state. The determined controller state can be the UPDATE-DR. Once in the determined controller state, the Test Access Port controller may also be operationally transitioned from an undetermined data state to a determined data state.

26 Claims, 12 Drawing Sheets

BOUNDARY SCAN WITH GROUND BOUNCE RECOVERY

TECHNICAL FIELD

The subject matter described here generally relates to boundary scan testing and, more particularly, to recovery from ground bounce during a boundary scan test.

BACKGROUND

1. The Boundary Scan Standard

IEEE/ANSI Standard 1149.1-1990, entitled "Standard Test Access Port and Boundary Scan Architecture," is incorporated by reference here and describes a testing scheme using "scan registers" to capture data from the input and output pins of an electronic device. The term "register" broadly refers to groups of digital logic storage units that are read or written as a unit. For example, a simple register may be constructed from a group of "flip-flops" whose outputs toggle simultaneously in response to a "clock" timing signal. In another type of register, called a "shift register," stored values can also be circulated between the storage elements in the register when a particular control signal is pulsed. Scan registers act like a group of flip-flops until they are switched into a test mode where they become one long shift register. This configuration allows scan register data to be captured in parallel and shifted serially between storage elements in the scan register. A detailed discussion of boundary scan testing and scan registers is provided in "The Boundary-Scan Handbook" by Kenneth P. Parker (Kluwer Academic Publishers, 2d edition) and "Agilent 3070 Family Boundary-Scan Fundamentals H7230A Opt 210 (E3795C)" (Agilent Technologies), both of which are also incorporated by reference here in their entirety. Testing systems that use boundary scan technology in order to facilitate integrated circuit testing, board testing, and/or system level testing are also commercially-available from a variety of vendors including Agilent Technologies Inc.; Corelis, Inc.; ASSET InterTech, Inc.; JTAG Technologies B.V., Goepel Electronics; Teredyne Inc.; Agere Systems; Sightsys LTD.; Intellitech Corp.; Acugen Software; and others.

Figure 1:
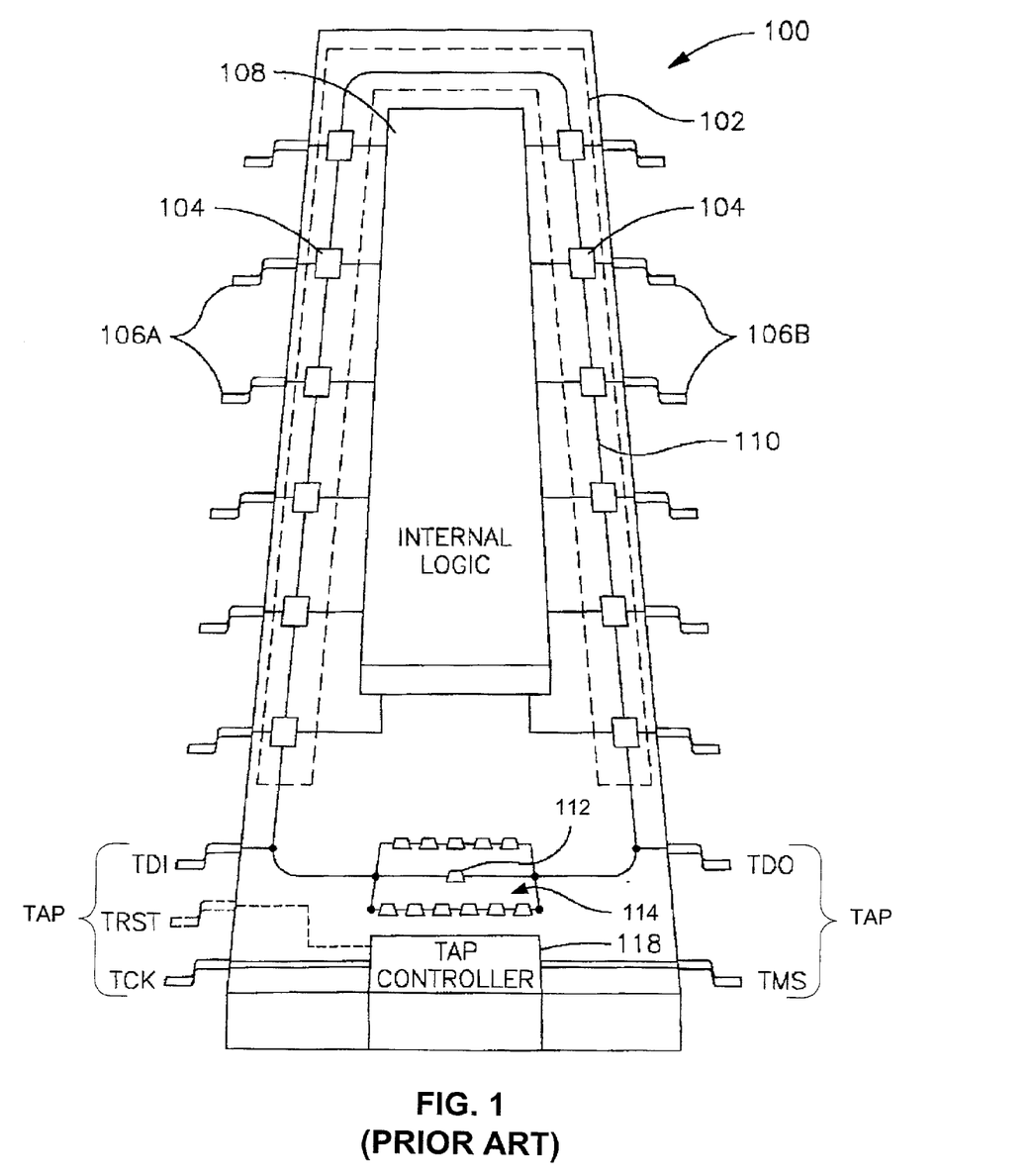
FIG. 1 is a schematic diagram of one embodiment of a conventional boundary scan device.

As shown in FIG. 1, the basic architecture for implementing boundary scan testing is provided on an integrated circuit 100 (or other device) by four (or, optionally, five) package pins forming the Test Access Port ("TAP"). The TAP is used for communicating with on-chip, boundary scan logic using a testing unit (such as Agilent Technologies' "3070 Series 3" in-circuit test system), or other device, to send and receive various signals via the TAP. The logic for the TAP includes a finite state machine, called the "TAP controller," that is driven by signals applied to the Test Clock ("TCK"), Test Mode Select ("TMS"), and optional Test Reset ("TRST") pins. The remaining two pins, Test Data In ("TDI") and Test Data Out ("TDO"), are used for serially shifting data into and out of registers as discussed below.

The registers in the boundary scan logic include at least two data registers ("DR") and an instruction register ("IR"). The "boundary (data) register" 102 is a scan register that is used to control and observe activities on the input and output pins of the integrated circuit 100 or other device. The boundary register 102 is formed by "boundary register cells" 104 disposed between each of the terminals 106 and the internal logic 108 of the integrated circuit 100 (but not the TAP pins). Each cell typically includes a shift register "capture" flip-flop and a parallel "update" flip-flop or latch. The serial inputs and outputs for each cell are connected to form a serial shift path, or "scan path," 110 through the boundary scan cells 104. For input pins 106A on the integrated circuit 100, the parallel inputs and outputs of the boundary register 102 are connected to the device pin and system circuitry, respectively. For output pins 106B, these assignments are reversed.

The second data register in the boundary scan logic is the "bypass register" 112. The bypass register 112 provides a one-bit shift path through the integrated circuit that can be used to shorten the length of the system scan path in a boundary scan chain, as described in more detail below with regard to FIG. 2.

The instruction register ("IR") 114 defines the mode in which the data registers operate. Similar to the data registers 110 and 112, the instruction register 114 also includes cells with a shift register "capture" flip-flop and a parallel "update" flip-flop or latch. Once the instruction register is connected between TDI and TDO, the shift register portion holds new instruction bits moving through the register while the output latches hold the "active" instruction in place while any shifting is done (in order to prevent "shift ripple"). The active instruction is then decoded and used to set the operational mode where a selected, or "target," data register is placed between TDO and TDI.

As mentioned above, the Boundary-Scan Standard also allows the scan paths 110 of multiple integrated circuits 100, and/or other devices having the boundary scan architecture shown in FIG. 1, to be linked together (and with other devices that do not include the boundary scan architecture 100) at the system level. For example, as illustrated by the system 200 shown in FIG. 2, the TDI pin (FIG. 1) of each of the boundary scan devices 230, 240, 250, 260 and 270 is linked to the TDO pin (FIG. 1) of the preceding device in the scan path chain 210. The TDI pin of the first device 220 receives a serial input signal from the testing unit (not shown), or other device, while the TDO pin of the last device 270 in the chain 210 provides an output signal to the testing unit or other device.

Figure 3:
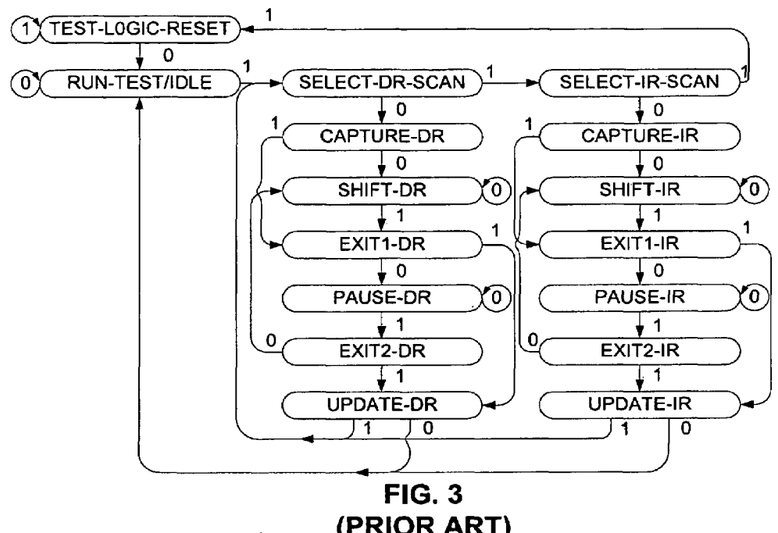
FIG. 3 is a state diagram for the TAP controller shown in the device of FIG. 1.

FIG. 3 is a state diagram 300 for the TAP controller (or "controller") 118 shown in FIG. 1 according to the Boundary Scan Standard. In FIG. 3, each of the sixteen states of the controller 118 is labeled with a name, and the arc between states is shown with a 0 or 1 to indicate the logic value of the TMS signal that must be set before the rising edge of the next TCK ("clock") pulse in order to cause the transition the controller to the next state. The TEST-LOGIC-RESET state is entered on power-up of the device 100 (FIG. 1) and disables the boundary scan control logic so that the integrated circuit, or other device, will operate normally. The RUN-TEST/IDLE state is then entered when TMS is (a logical) low and the controller 118 remains in this state as long as TMS is low. The remaining states are arranged in two vertical columns with the data column (on the left) referencing the targeted data registers ("DR") 102 and the instruction column (on the right) referencing the instruction register ("IR") 114.

When the TAP controller 118 is in the RUN-TEST/IDLE state and TMS goes high, the controller enters the SELECT-DR-SCAN state on the next (rising edge of TCK) clock pulse. This is a temporary controller state that is exited on the next rising edge of TCK. If TMS is held low on the next (rising edge of TCK) clock pulse, then the controller 118 goes into the CAPTURE-DR state in the data column, and a scan sequence is initiated for the selected test data register.

If TMS is kept high during the SELECT-DR-SCAN state, then, on the next clock pulse, the controller 118 moves into the first state in the instruction column, SELECT-IR-SCAN.

This is also a temporary state where a decision is made whether to either continue in the instruction column or reset the controller by returning to the TEST-LOGIC/RESET state. If TMS is held low during the SELECT-IR-SCAN state, then the controller 118 moves into the CAPTURE-IR state on the next clock pulse and a scan sequence is initiated for the instruction register 114.

More specifically, during the CAPTURE-IR state, the shift register portion of the instruction register 114 parallel loads a pattern of fixed logic values on the rising edge of TCK. The TAP controller 118 then either enters the SHIFT-IR state if TMS is low, or the EXIT-IR state if TMS is high.

In the SHIFT-IR state, the instruction register 114 is connected between TDI and TDO and the captured pattern is shifted one stage toward the serial input for the rising edge of each clock pulse while TMS is low. Simultaneously, new instruction bits are shifted out of the instruction register 114 to TDI during the falling edge of each clock pulse. The EXIT-IR state is then entered when TMS goes high and is simply another temporary controller state in which a decision is made whether to enter the PAUSE-IR or UPDATE-IR state.

In the PAUSE-IR state, the TAP controller 118 allows the shifting of the instruction register 114 to be temporarily halted, typically in order to accommodate the slower speed of other test equipment. The controller 118 remains in this state while TMS is low and then moves to EXIT2-IR on the next rising edge of TCK when TMS high. EXIT2-IR is another temporary controller state for determining whether to return to the SHIFT-IR state, or move on to the UPDATE-IR state.

In the UPDATE-IR state, the instruction that was previously shifted into the instruction register 114 is latched, on the falling edge of TCK, into the hold portion of the instruction register. Once the new instruction has been latched, it becomes the "current instruction" and sets a new operational mode. From this state, the controller 118 can then enter the SELECT-DR-SCAN state if TMS is high, or the RUN-TEST/IDLE state if TMS is low. The remaining states for the data register column are similar to those for the instruction register column.

For example, during the UPDATE-DR state, a response pattern (sometimes referred to as "vector" data) is latched on the falling edge of TCK from the shift register onto the parallel outputs of the targeted data register that is set by the current instruction. The BYPASS instruction (all 1s in the instruction register) places the single-bit bypass data register 112 between TDI and TDO in order to provide a short path through the component. The EXTEST instruction (with a pattern that is left to the circuit designer), on the other hand, targets the boundary register 102 between TDI and TDO so that, during the SHIFT-DR state, vector data is shifted in (on the rising edge of TCK) and out (on the falling edge of TCK) of the boundary registers 102 while TMS remains low. The new data is then latched into the parallel outputs of the boundary register 102 on the falling edge of TCK during the UPDATE-DR state.

2. Ground Bounce During Boundary Scan

Certain boundary scan tests are known to be particularly susceptible to ground bounce, as discussed in "In-Circuit Boundary Scan Connection Test Ground Bounce: A Case Study In Prevention & Cures," presented at the NepConWest 2000 Symposium by Raymond Balzar and Philip King; "Ground Bounce Basics and Best Practice," by Phil King available from Agilent Technologies; and U.S. Pat. Nos. 6,000,050 and 6,243,843; all of which are incorporated by reference here in their entirety. In general terms, ground bounce is a transient voltage difference between the ground reference points in two parts of a circuit. This typically occurs when current through an impedance (typically, an inductance and/or resistance) in the power distribution pathway creates a voltage drop across internal circuit nodes that are supposed to have the same voltage value (typically, power or ground). For board testing, this voltage differential usually arises between the test system ground and the device under test. However, ground bounce may also occur during integrated circuit level, or system level, testing.

Ground bounce can be minimized through proper integrated circuit design, board layout, and tester to board/system connections. There are also other approaches that attempt to mitigate the effects of ground bounce once they occur. These latter approaches typically alter the boundary scan test pattern in an attempt to minimize or optimize simultaneous pin transitions by 1) arranging the timing of when it occurs to be at a "safe" point in the test sequence; 2) using the TAP state diagram to trap the controller at one state; 3) wiring the test fixture in such a way that the ground bounce is minimized for the TCK, TMS and TRST pins; and 4) using a controlled slew rate on TCK to mask the ground bounce.

Ground bounce typically manifested itself as a superimposed voltage fluctuation in a signal which can sometimes be measured using conventional techniques. If that signal is TCK, and the fluctuation is large enough to inject a new clock cycle, then the bounce can cause loss of synchronization with the expected TAP controller state shown in FIG. 1. Inductive ground bounce is particularly problematic in this regard due to the current surges created as large numbers of drivers change state simultaneously and is expected to occur most often on the falling edge of TCK while in either of the UPDATE-IR or UPDATE-DR ("UPDATE") states, particularly when in, or going out of, the EXTEST mode. A single boundary scan test operation will often have many such UPDATE events and corresponding opportunities for ground bounce.

Ground bounce that causes an extra TCK pulse during an UPDATE state can be recognized, under certain conditions, by examining the target bits that are shifted and noting an instruction register capture pattern, rather than the normally expected target bit pattern. Under other conditions, ground bounce can also be inferred from a disabling of the TDO pin during a shift state. Yet another ground bounce detection scheme is discussed in U.S. Pat. No. 6,243,843. However, when improper boundary scan test results are obtained, a ground bounce problem is more often presumed to be one of many possible causes and the test is simply rerun while implementing a ground bounce suppression algorithm. Of course, if ground bounce is anticipated, then a ground bounce suppression algorithm may be applied from the start of the test.

One conventional ground bounce suppression algorithm involves holding TMS low before the falling edge of TCK while in the UPDATE-DR and/or UPDATE-IR states. A spurious TCK pulse at the falling edge of TCK will therefore cause the TAP controller to go into the RUN-TEST/IDLE state where it will remain, during any further ground-bounce-induced clock pulses, until TMS is made high. After waiting a suitable period of time (i.e., number of clock pulses) for the effects of any such ground bounce to dissipate, the test can then be continued with the same input sequence. Thus, if a ground bounce induces multiple clock pulses during the transition from one of the UPDATE states, and TMS is held low, the controller 118 can be "trapped" in the RUN-TEST/IDLE state until the effects of the ground bounce on TCK have dissipated and the test can be continued.

However, this trap will not be successful if the ground bounce also causes the TMS line to appear to the controller 118 as a logical 1 at the time of the spurious clock signal. In that case, the TAP controller 118 will move to another state where it will not be trapped, regardless of whether TMS is kept low. Furthermore, the input bit pattern sequence that was applied to the TAP pins when TMS moved high is unlikely to be synchronized with, or appropriate for, the state of the TAP controller induced by the ground bounce when the test continues.

SUMMARY

These and other drawbacks of such conventional approaches are addressed here by providing a method, apparatus, logic, and data signal for recovering from ground bounce during boundary scan testing, including, but not limited to, during integrated circuit testing, board testing, and/or system level testing. The technology described here generally relates to operationally transitioning a Test Access Port controller from any of at least three, or at least four, undetermined controller states induced by the ground bounce to a determined controller state. For example, the undetermined controller states may be selected from the group consisting of an UPDATE state, a RUN-TEST/IDLE state, a SELECT-DR-SCAN state, and a CAPTURE-DR state. The determined controller state may be UPDATE-DR. The description also relates to operationally transitioning the Test Access Port controller from an undetermined data state to a determined data state. For example, the data state transitioning may begin when the Test Access Port controller has reached determined controller state.

BRIEF DESCRIPTION OF THE DRAWINGS

Various aspects of the invention will now be described with reference to the following figures ("FIGS.") which are not necessarily drawn to scale, but use the same reference numerals to designate corresponding parts throughout each of the several views.

DETAILED DESCRIPTION OF THE PREFERRED EMBODIMENTS

Figure 2:
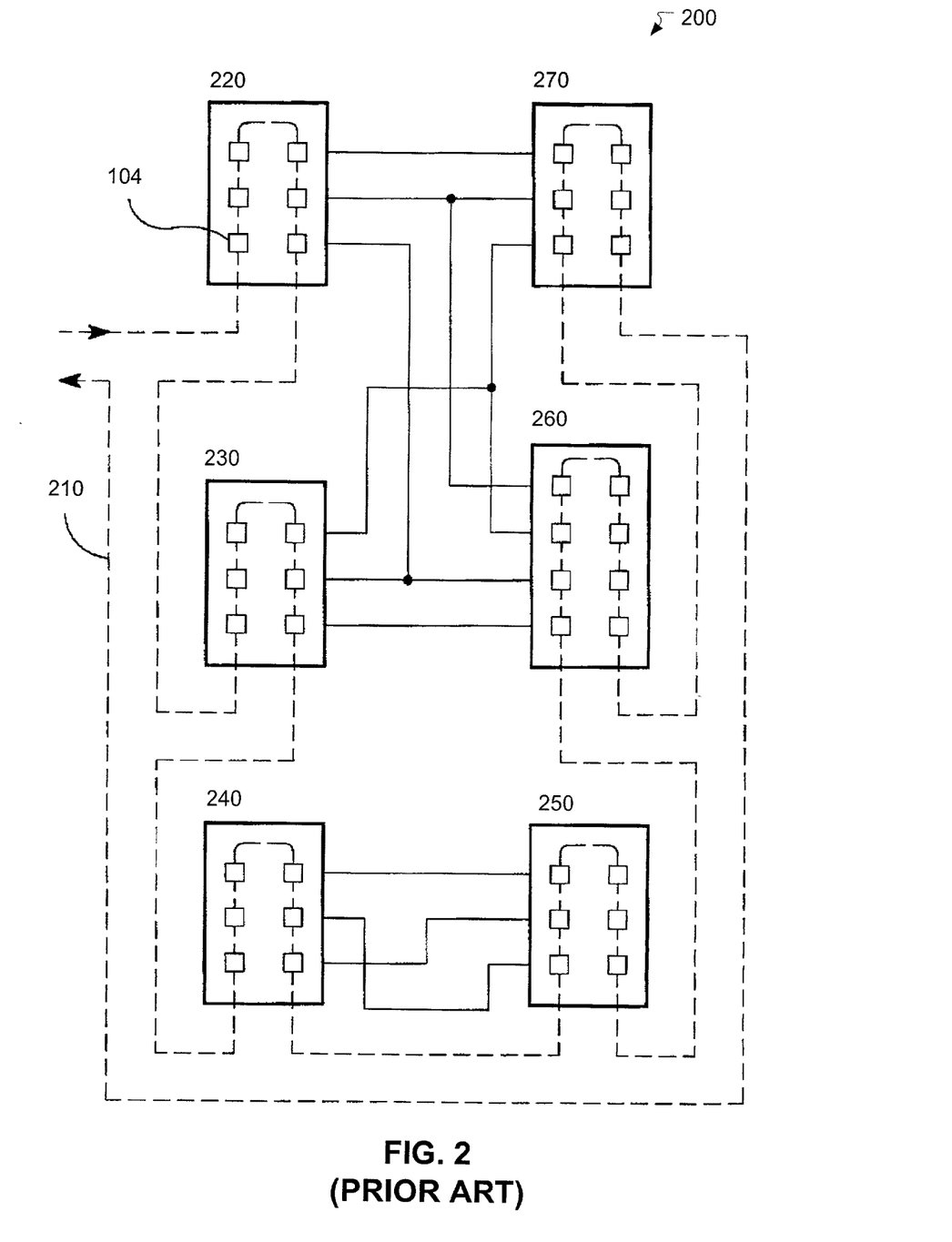
FIG. 2 is a schematic diagram of one embodiment of a conventional boundary scan system including several boundary scan devices according to FIG. 1.
Figure 4:
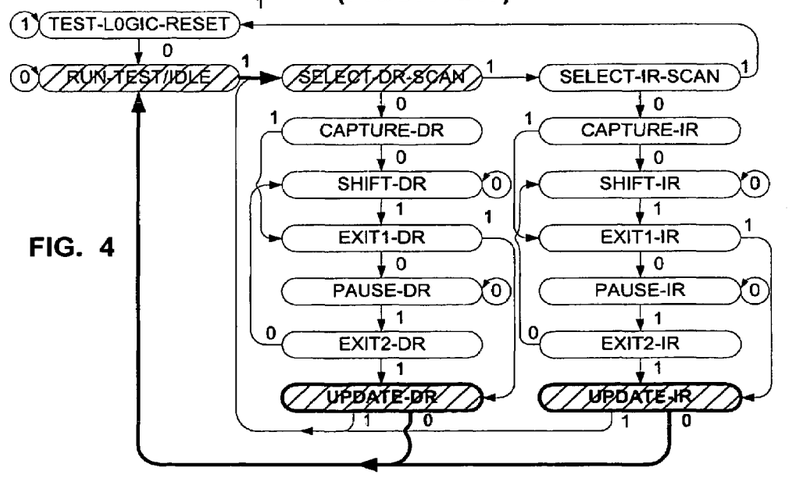
FIG. 4 is the state diagram of FIG. 3 illustrating a group of three undetermined controller states induced by ground bounce during a transition from an UPDATE state.

FIGS. 4–7 are copies of the state diagram shown in FIG. 3 for a TAP controller including, but not limited to, the controller 118 shown in FIG. 1 and the controllers which are not shown in FIG. 2. In FIGS. 4–7, the bold lines indicate the current state being transitioned from and the corresponding value of TMS for the transition. The cross-hatching in these figures further indicates the various possible underdetermined controller states that may have been induced by a ground bounce. For example, the cross-hatching shown in FIG. 4 illustrates that a ground bounce occurring during one of the UPDATE-DR or UPDATE-IR "UPDATE" states can induce the controller 118 into one of three undetermined states including either of the UPDATE states, RUN-TEST/IDLE, and SELECT-DR-SCAN.

In general terms, FIG. 4 illustrates so-called "unstable" (or non-repeatable), uniform ground bounce that causes a spurious voltage in the signals being applied to the TCK and/or TMS pin(s). Unstable bounce will only sometimes transition the TAP controller away from an update state. Thus, one of the UPDATE-DR or UPDATE-IR states is included in the group of three undetermined states induced by a ground bounce that are shown in FIG. 4. The term "uniform" is used here to refer to all the circuitry in the boundary-scan test responding substantially identically. However, as discussed below, these same principles may also be applied to non-uniform ground bounce. The methods described here for unstable bounce can also be applied to stable, or repeatable, forms of ground bounce and are thus generally applicable.

More specifically, FIG. 4 illustrates a situation where no bounce, a single bounce of TCK, or a single bounce of TCK and a single bounce of TMS, induces the TAP controller 118 into one of the three undetermined states shown with cross-hatching (where UPDATE-DR and UPDATE-IR are counted together as an UPDATE state). The controller 118 may also arrive at one of these undetermined states due to other circumstances. The term "undetermined state" is used here to refer to the fact that the state that is induced by the ground bounce will not necessarily be synchronized with the expected state of the controller and/or the input signals being applied to the Test Access Port for the expected controller state.

For example, if a single bounce occurs on TMS or TCK that does not induce a transition from one of the UPDATE states, then the TAP controller 118 will not be detrimentally affected and will remain synchronized with the signals being applied to the Test Access Port. On the other hand, if TMS is kept low, and the ground bounce induces an extra pulse on TCK, then the controller 118 will transition early into the RUN-TEST/IDLE state. Similarly, if TMS is low during a first spurious TCK pulse and then TCK is high (perhaps due to the ground bounce) for a second spurious TCK pulse, then the controller 118 will transition early to the SELECT-DR-SCAN state. Consequently, signals may then be applied to the TAP under the mistaken assumption that the controller 118 is still in the appropriate UPDATE state when, in fact, it is in one of the undetermined states.

Figure 5A:
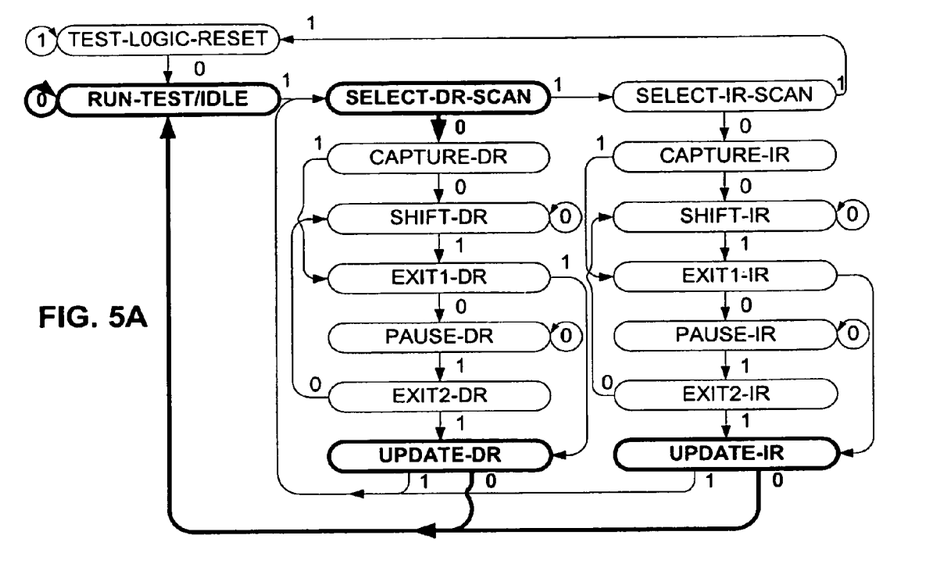
FIGS. 5A–5F show the state diagram of FIG. 3 with controller transitions for recovering from any of the group of three undetermined controller states shown in FIG. 4.

FIGS. 5A–5F use the state diagram of FIG. 3 to show controller transitions for recovering from any of the three undetermined states induced by ground bounce (and shown with cross-hatching) in FIG. 4. In FIG. 5A, TMS continues to be held low on the next clock cycle following the ground bounce. Consequently, if the controller 118 had remained properly synchronized in the UPDATE-DR or UPDATE-IR state after the ground bounce, then holding TMS low on the next true TCK pulse will transition the controller 118 into the RUN-TEST/IDLE state as if the ground bounce had not occurred. Similarly, if the controller 118 was induced by the ground bounce into the RUN-TEST/IDLE, then holding TMS low on the next TCK pulse will trap the controller 118 in the RUN-TEST/IDLE state as long as TMS continues to be held low.

If an UPDATE state and the RUN-TEST/IDLE state are the only two candidate undetermined states that are considered, then holding TMS low on the next TCK pulse after the ground bounce will have effectively trapped the controller 118 in the RUN-TEST/IDLE state, similar to the conventional ground bounce suppression algorithm discussed above. However, in contrast to conventional approaches, the recovery technique described here also accounts for the fact that the ground bounce may have alternatively induced the SELECT-DR-SCAN state that is shown with cross-hatching in FIG. 4. If the controller has, in fact, been induced by ground bounce to SELECT-DR-SCAN, then continuing to hold TMS low will transition the controller into the CAPTURE-DR state as shown in FIG. 5A.

Figure 5B:
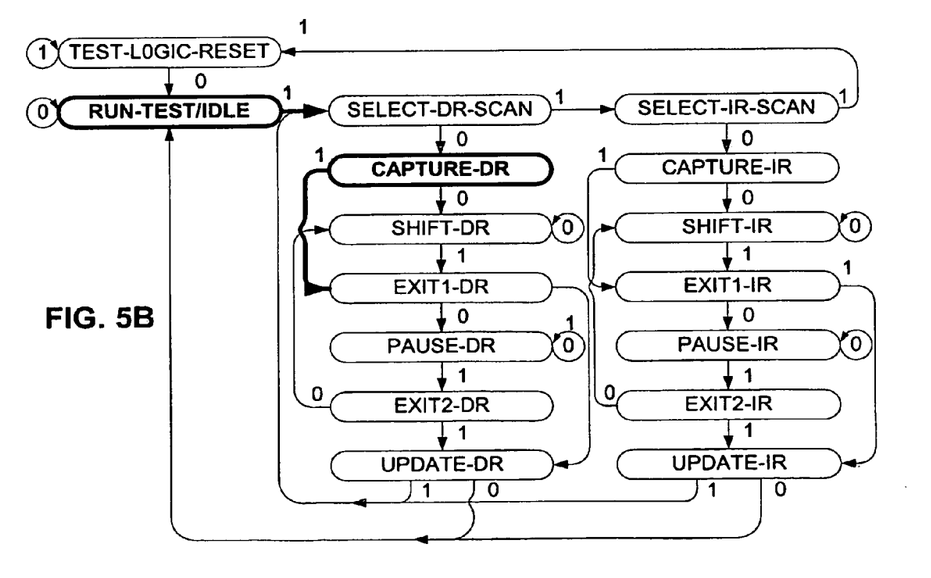

After the possible transitions shown in FIG. 5A, the controller is in either the RUN-TEST/IDLE state or the CAPTURE-DR state shown with boldface type in FIG. 5B. However, which of these two controller states that the controller 118 is actually in is still undetermined. As further shown in FIG. 5B, holding TMS high on the next clock pulse will transition the controller 118 from one of the resulting two candidate states from FIG. 5A. Thus, the controller 118 is transitioned from either the RUN-TEST/IDLE state into SELECT-DR-SCAN, or from the CAPTURE-DR state into EXIT1-DR in FIG. 5B.

Figure 5C:
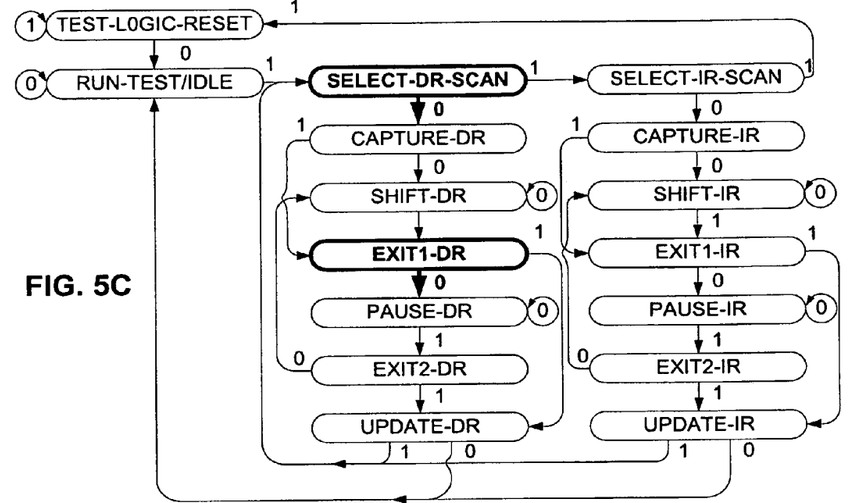
Figure 5D:
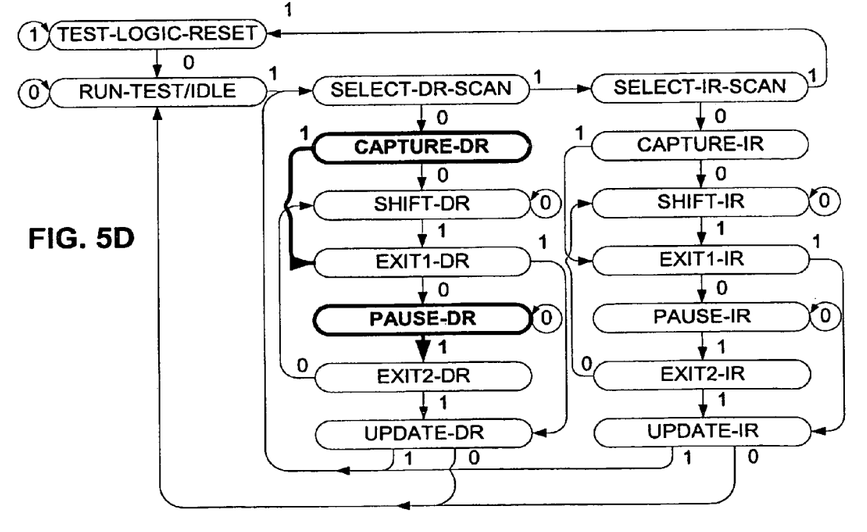
Figure 5E:
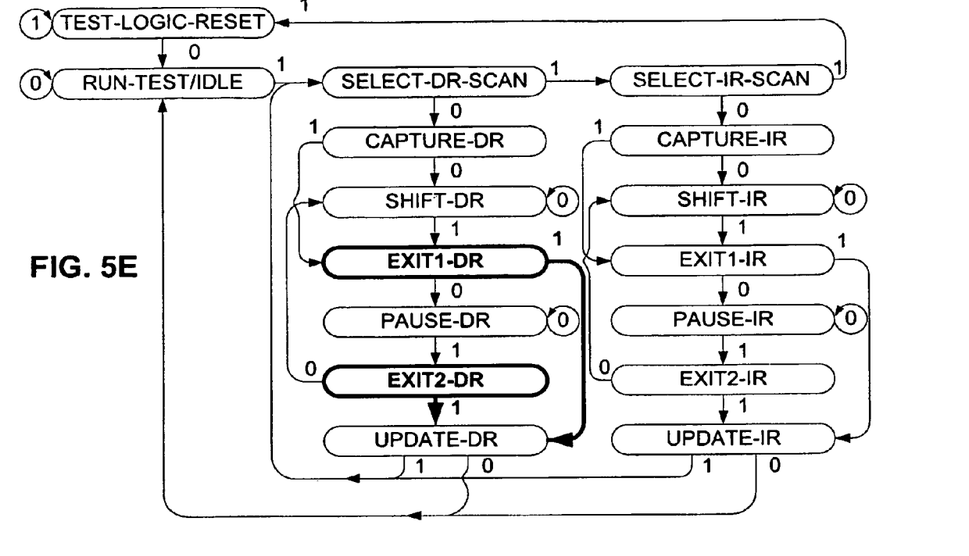

Turning to FIG. 5C, TMS is held low on the next clock signal and the controller 118 is transitioned either from SELECT-DR-SCAN to CAPTURE-DR, or from EXIT1-DR to PAUSE-DR. Next, as shown in FIG. 5D, TMS is held high on the next clock pulse and the controller 118 is transitioned either from CAPTURE-DR to EXIT1-DR or from PAUSE-DR to EXIT2-DR. Turning to FIG. 5E, the controller 118 is now in either the EXIT1-DR state or the EXIT2-DR state.

Figure 5F:
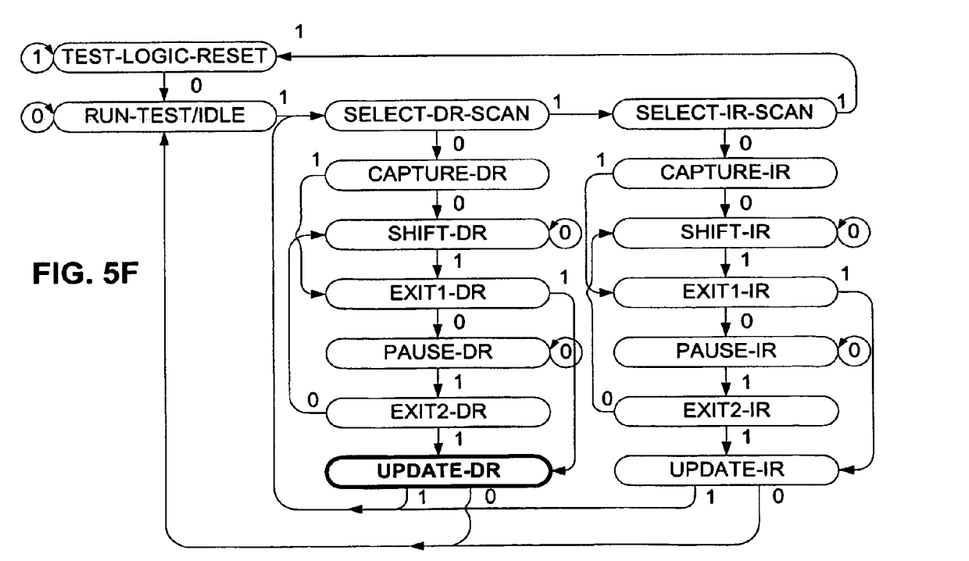

However, regardless of which of the two undetermined, or "candidate," states is the actual state of the controller 118 FIG. 5E, holding TMS high on the next clock signal will result in the controller transitioning to (and converging on) the UPDATE-DR state shown in FIG. 5F. At this point, the actual state of the controller is known, or "determined," to be UPDATE-DR regardless of which of the undetermined states shown with cross-hatching in FIG. 4 was actually induced by the ground bounce.

FIGS. 5A–5F therefore illustrate a method of operationally transitioning a Test Access Port controller from any of the three undetermined controller states shown in FIG. 4 to the determined state shown in FIG. 5F. The term "operationally transitioning" is used here to convey that the controller 118 has not been reset during any of the transitions. The three undetermined controller states in FIG. 4 are an UPDATE state (UPDATE-DR or UPDATE-IR) RUN-TEST/IDLE, or SELECT-DR-SCAN, while the determined controller state shown in FIG. 5F is UPDATE-DR. The controller 118 was operationally transitioned in FIGS. 5A–5F by providing a TMS input signal having the following bit pattern for a consecutive series of rising edges of TCK pulses: low, high, low, high, and high.

The ground bounce recovery method shown in FIGS. 5A–5F transitions through the CAPTURE-DR state (in FIGS. 5B or 5D) during which time data is parallel-loaded into the shift portion of the boundary register 102 shown in the scan path 110 in FIG. 1, or corresponding boundary registers (not labeled) in the scan path 210 shown in FIG. 2. Thus, the data in the boundary register(s) 102 will be updated, and usually changed, during the pertinent CAPTURE-DR state shown in FIG. 5B or 5D. Only in rare cases will this captured data be the same as was intended during the synchronized UPDATE-DR state shown in FIG. 5F.

If it is known that these circumstances will occur, such as by design of the boundary scan cell type, then the recovery method shown in FIGS. 5A–5F will be successful. However, it is more likely that the serial vector data will have to be re-shifted at sometime during the ground bounce recovery so that the UPDATE-DR state does not result in the output changing to the newly captured, and unwanted, values.

In order to address the problem of capturing new values (in FIGS. 5B or 5D) which are then updated (in FIG. 5F), the transitions in FIGS. 5A–5F may be supplemented with a subsequent loop through the SHIFT-DR state in which the correct vector data is subsequently re-shifted into the boundary register(s) in scan paths 110 (FIG. 1) or 210 (FIG. 2) before continuing with the test. However, as described below, FIGS. 7A–7J illustrate an improved set of recovery transitions that automatically provided the necessary shifting and also account for an additional undetermined state shown in FIG. 6 that may be induced by ground bounce.

Figure 6:
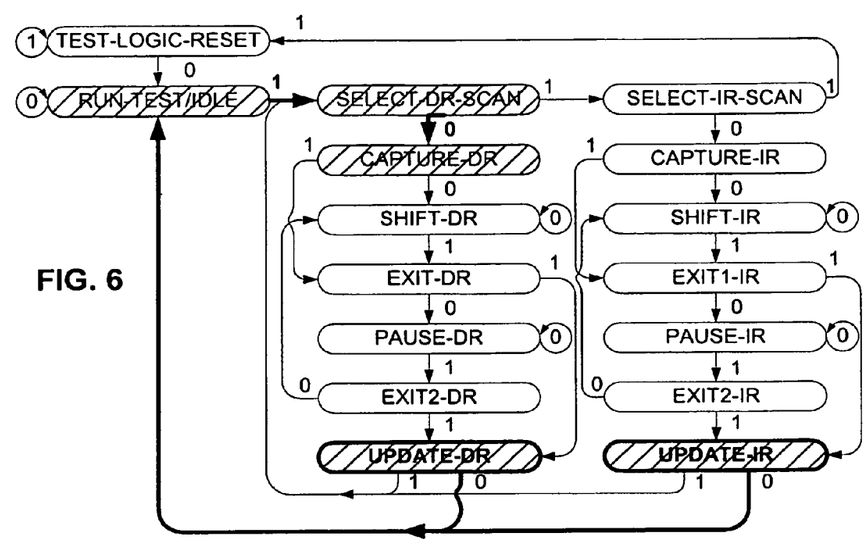
FIG. 6 is the state diagram of FIG. 3 illustrating a group of four undetermined controller states induced by ground bounce during a transition from an UPDATE state.

FIG. 6 is substantially the same as FIG. 4, except that it further includes the CAPTURE-DR state as another undetermined candidate state that may have been induced by ground bounce while TMS is held low during and UPDATE state. For example, this situation might occur when the system experiences two bounces on TCK with TMS bouncing to a logical 1 on only the first bounce of TCK.

Figure 7A:
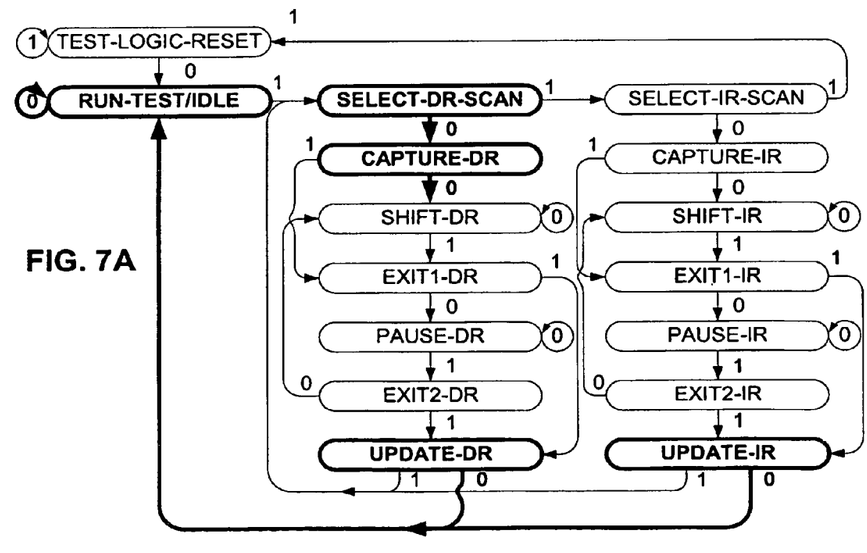
FIG. 7A–7J show the state diagram of FIG. 3 with controller transitions for recovering from any of the group of four undetermined controller states shown in FIG 6.
Figure 7B:
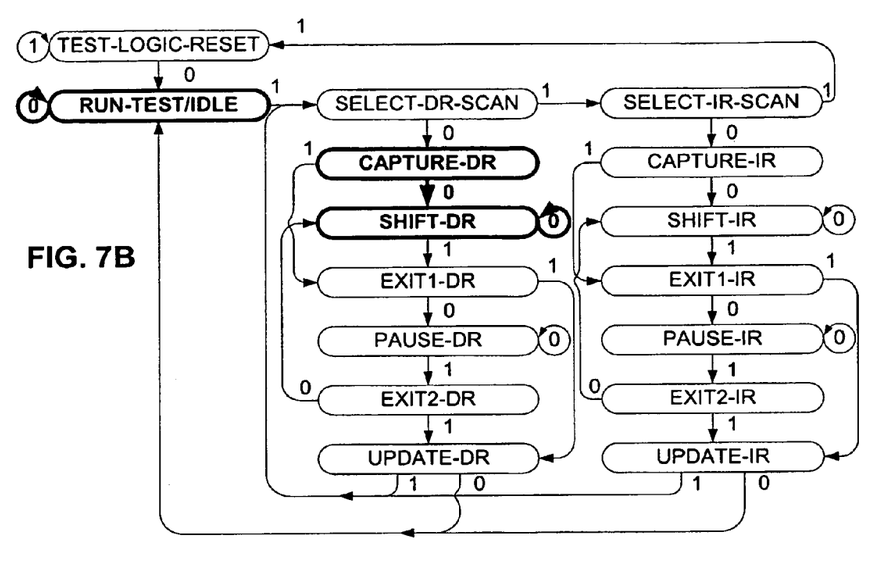

Starting with the ground bounce induced states shown with boldface type in FIG. 7A, TMS continues to be held low on the next clock pulse (i.e., rising edge of TCK) so that the TAP controller 118 transitions to one of the candidate states shown in FIG. 7B. When compared to FIG. 5B, FIG. 7B illustrates that the controller 118 may be in one additional undetermined state, SHIFT-DR. At this point, the controller transitions shown in FIG. 7B also diverge from the transitions shown in FIG. 5B. In particular, TMS continues to be held low during the transition shown in FIG. 7B. The controller 118 is therefore transitioned to one or the other of the candidate states RUN-TEST/IDLE or SHIFT-DR illustrated in FIG. 7C.

Figure 7C:
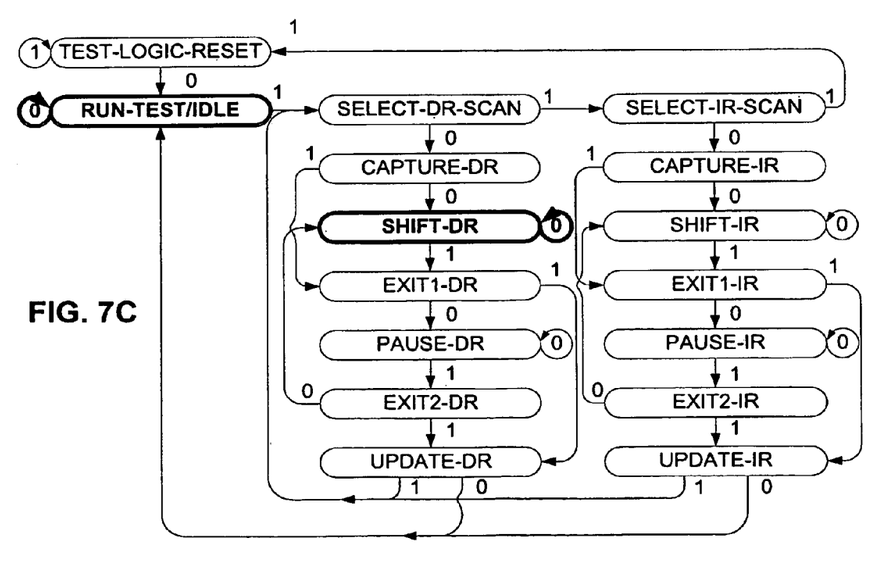

In FIG. 7C, TMS continues to be held low while TDI is provided with the appropriate vector data. If the controller 118 is actually in the RUN-TEST/IDLE state, this new data will have no effect. Alternatively, if the controller 118 is actually in the SHIFT-DR state, the proper data will be loaded into the boundary register(s) 102.

Figure 7D:
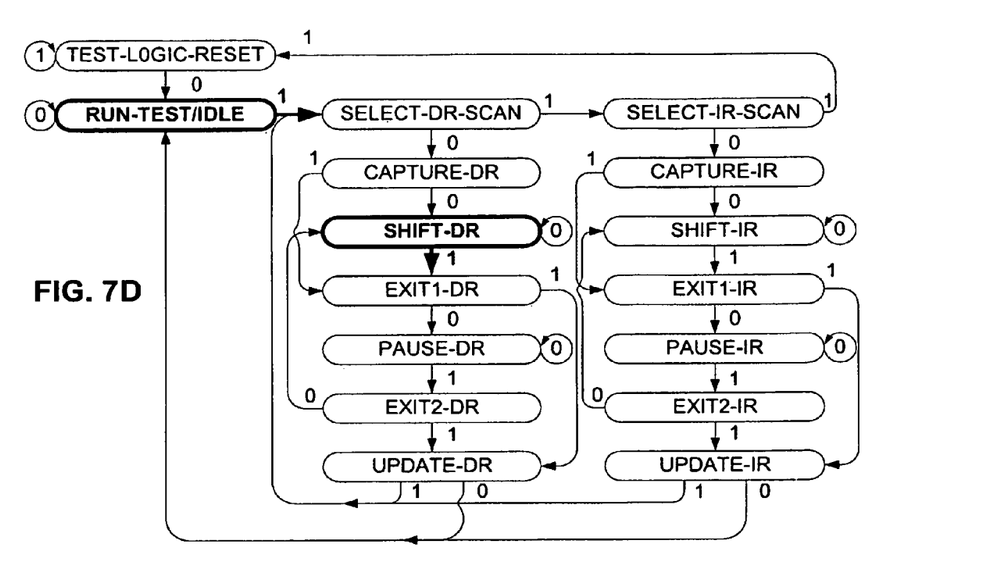
Figure 7E:
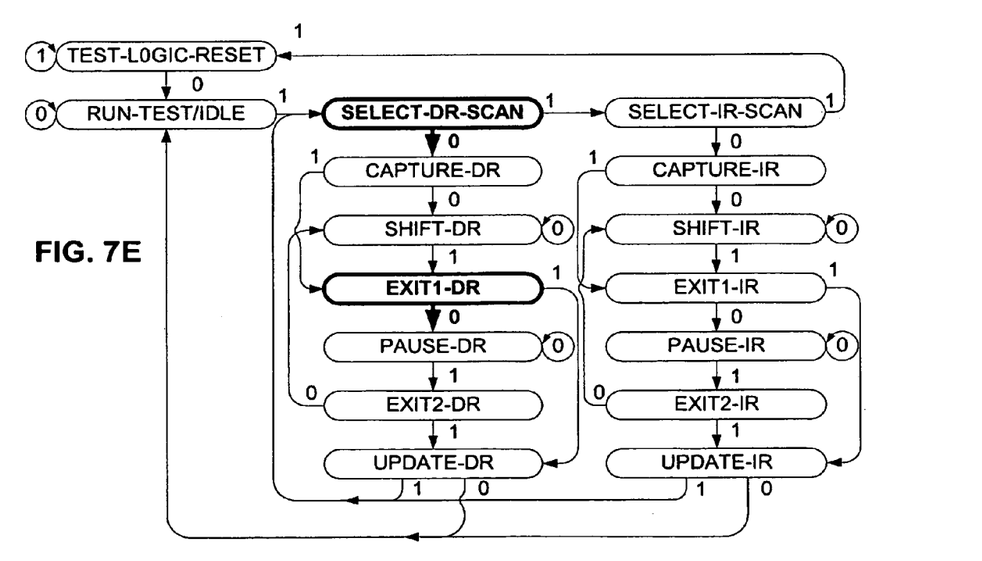
Figure 7F:
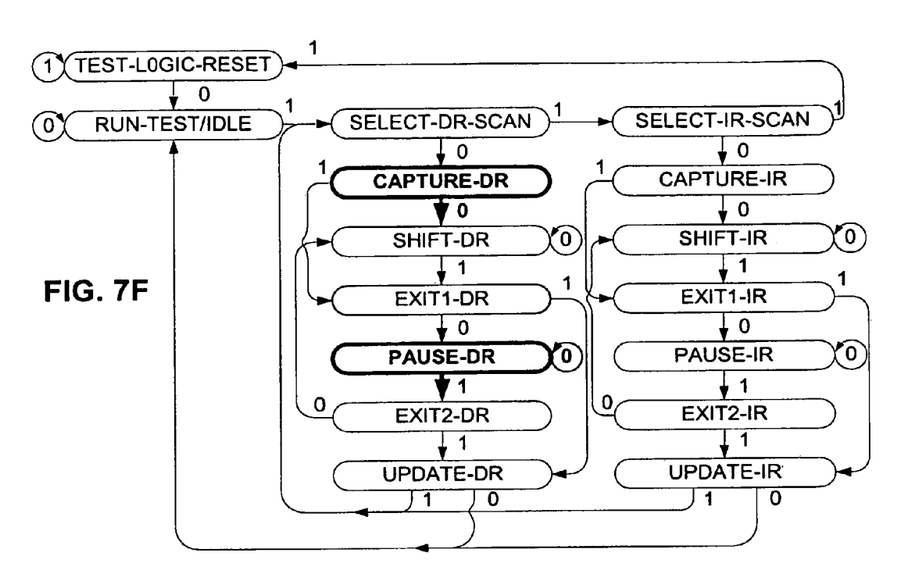

Moving on to FIG. 7D, at the end of the input data sequence, TMS is moved high in order to transition the controller 118 from the RUN-TEST/IDLE or SHIFT-DR state. Then, TMS is held low for the next two clock pulses (rising edges of TCK) as shown in FIGS. 7E and 7F until the controller arrives at one of the two candidate states shown in FIG. 7G.

Figure 7G:
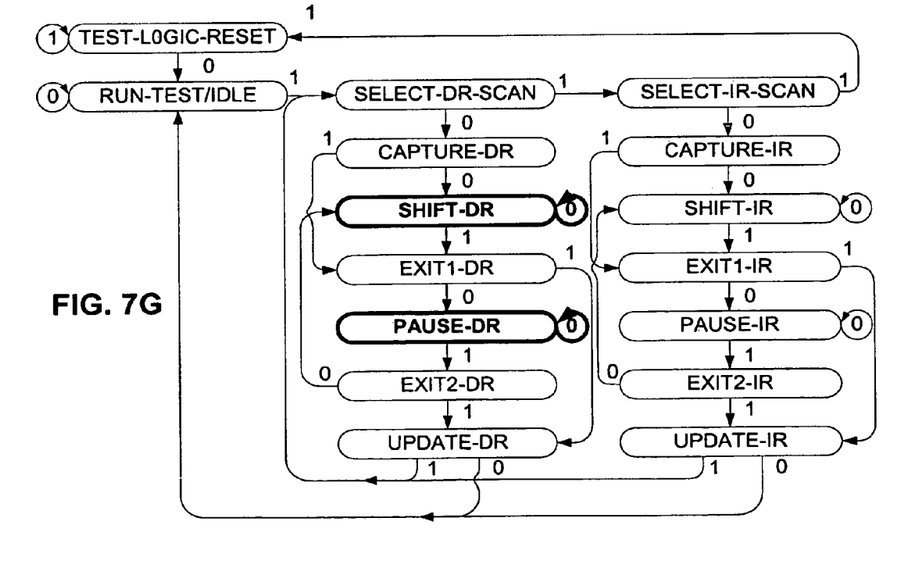

In FIG. 7G, TMS is held low while the input data sequence is again applied to TDI for the appropriate number of clock pulses. If the controller is in the SHIFT-DR state, then the correct data sequence will be loaded into the boundary registers 102. If, on the other hand, the controller 118 is actually in the PAUSE-DR state, the data will already have been loaded during SHIFT-DR in FIG. 7C and will not be affected.

Figure 7H:
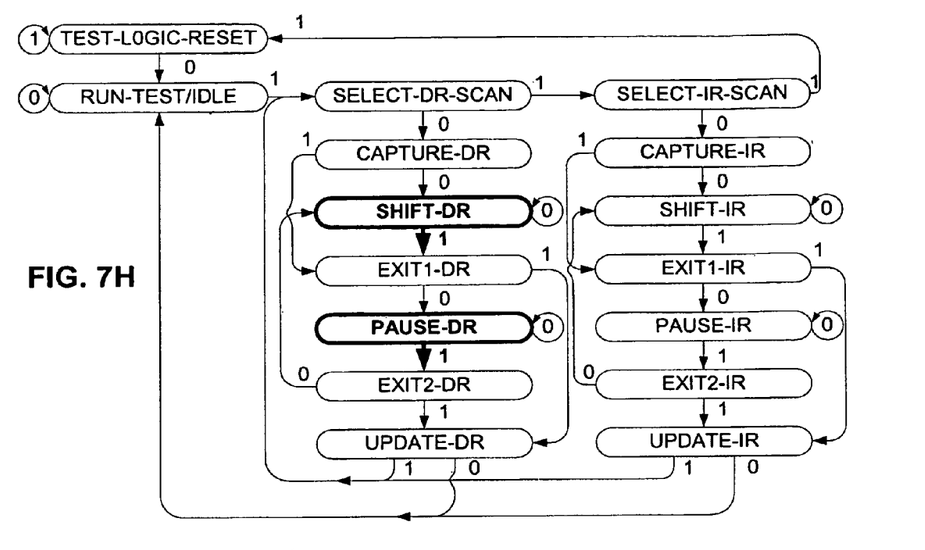
Figure 7I:
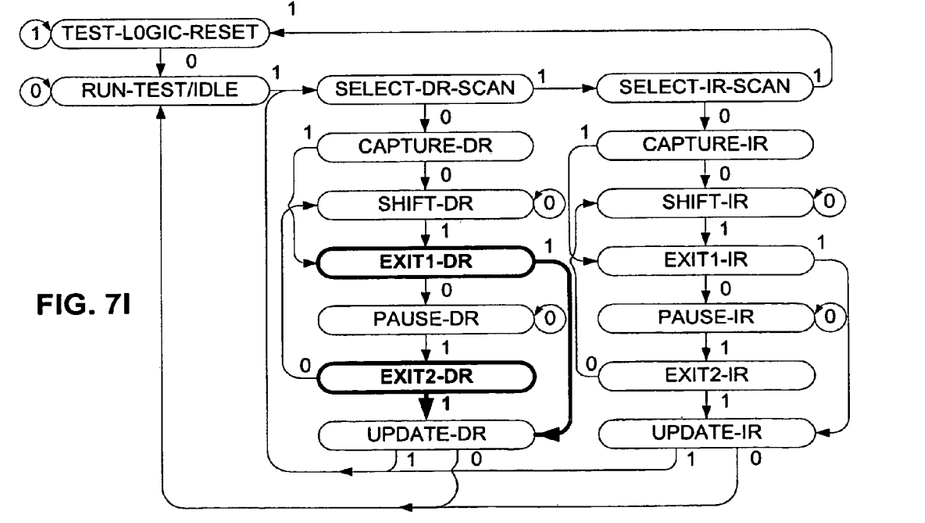
Figure 7J:
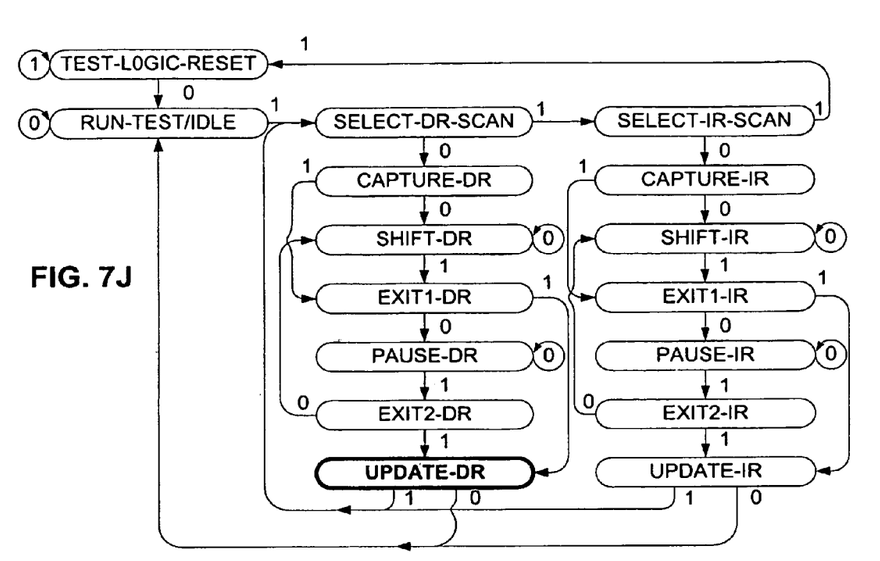

After the appropriate number of clock pulses for shifting the data in FIG. 7G, TMS is moved high in FIG. 7H for two additional clock cycles (rising edges of TCK), which causes the controller to transition through either of the two candidate states shown in FIG. 7I until converging upon the determined UPDATE-DR state shown in FIG. 7J. At this point the actual state of the controller is known, or "determined", to be UPDATE-DR regardless of which of the four undetermined states shown with cross-hatching in FIG. 6 was actually induced by the ground bounce.

The ground bounce recovery method shown in FIGS. 7A–7J is an improvement over the method shown in FIGS. 5A–5F in that any time the controller 118 transitions through the CAPTURE-DR state (FIGS. 7B and 7F) the test data is reshifted during the next set of clock pulses (FIG. 7C and 7G). Consequently, the appropriate vector data will be loaded in the boundary register(s) 102 before arriving at the determined UPDATE-DR state (FIG. 7J). At that point, if the ground bounce has uniformly affected all the devices in the boundary scan chain 210 (FIG. 2), then the system is completely recovered and ready to proceed to the next part of the test.

For non-uniform ground bounce, where the entire boundary scan chain 210 (FIG. 2) is not uniformly affected, the recovery method shown in FIGS. 7A–7J and 8 may be difficult to implement because the entire boundary scan chain will not necessarily be in the same state when the vector data is being shifted in. For example, if the entire chain 210 is not in the SHIFT-DR state shown in FIGS. 7C and 7G, then some of the data will not get shifted into the appropriate target locations. Consequently, after a non-uniform ground bounce followed by the state transitions shown in FIGs. 7A–7J, the entire boundary scan chain will not be fully re-initialized to the desired data values.

Figure 8:
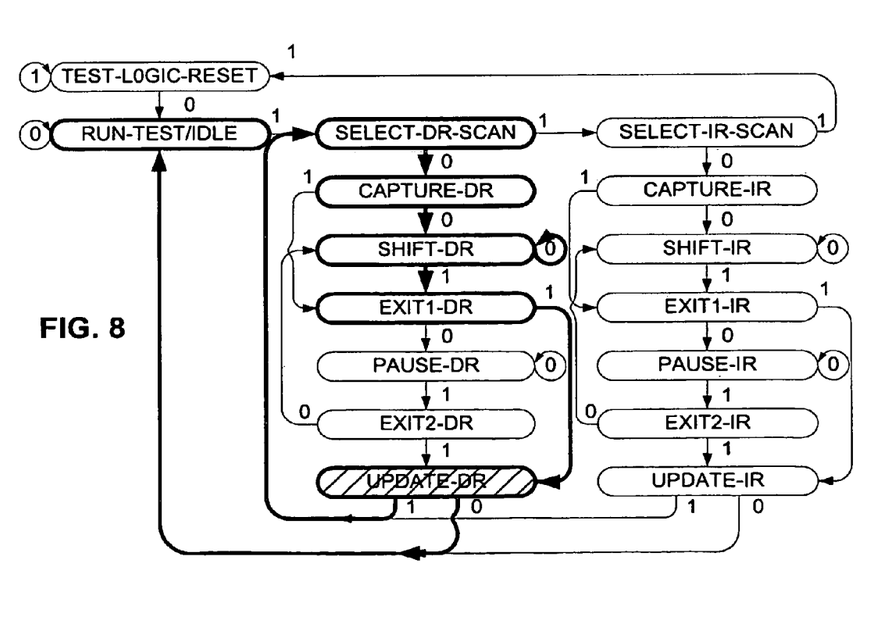
FIG. 8 shows the state diagram of FIG. 3 with controller transitions for recovering from an undetermined data state after arriving at a determined controller state.

There are at least two approaches to addressing these problems associated with non-uniform ground bounce. First, if internal parts of the boundary scan chain 210 (FIG. 2) are not accessible, then the methods shown in FIGS. 5A–5F and 7A–7J for achieving a determined controller state may be supplemented with the method shown in FIG. 8 for achieving a determined data state. In FIG. 8, the TAP controller(s) are operationally transitioned from a determined controller state, but undetermined data state, to the determined controller state and a determined data state. More specifically, during the SHIFT-DR state shown in FIG. 8, all of the serial data will again be shifted into the boundary scan system. At that point, the entire chain should be in a uniform data state and the data should have properly re-initialized all of the elements of the boundary chain. It should also be noted that the last transition from EXIT1-DR to UPDATE-DR may also take other paths, such as paths that pass through PAUSE-DR and/or EXIT2-DR.

It is possible that additional ground bounce may be experienced at the end of the process shown in FIGS. 5F and 7J or the end of the process shown in FIG. 8. The boundary scan test could then be modified so that any further ground bounce is uniform. Alternatively, if there is electrical access to intermediate points of the boundary scan chain 210, then these intermediate points may be used as serial data inputs for the re-initialization process.

In the latter case, the TDI inputs to the separate elements in the boundary scan chain 210 (FIG. 2) may be altered intelligently. For example, only data that is necessary to initialize a particular device will be applied to the TDI pin of that device. If the devices have unequal numbers of cells in their boundary registers, then that aspect of the test must also be accommodated since shifting will occur simultaneously for all the devices. For example, unequal numbers of boundary cells may be accommodated by padding the initial input data for the shorter registers in order to equalize the number of inputs for all devices.

Such a multi-point recovery method may also be used if only some of the intermediate points between devices are electrically accessible. In that case, the method shown in FIG. 8 could be used along with applying data at various TDI pins in the boundary scan chain 210, simultaneously. This data could also be padded based upon the difference between the shortest and longest boundary registers between the TDI input points, or between the last TDI input and the final TDO output. Moreover, intermediate access may be designed into the device under test so as to assure some minimum level of recovery and/or to keep ground bounce levels below some threshold without excessively increasing the complexity of the test.

It should be emphasized that the embodiments described above, and particularly any "preferred" embodiments, are merely examples of various implementations that have been set forth here to provide a clear understanding of various aspects of the invention. One of ordinary skill will be able to alter these embodiments without substantially departing from scope of protection defined solely by the proper construction of the following claims.

The invention claimed is:

1. A method comprising:
    starting a boundary scan test;
    transitioning a Test Access Port (TAP) controller when ground bounce occurs during the boundary scan test, the TAP controller capable of being transitioned from a first undetermined controller state induced by ground bounce, a second undetermined controller state induced by ground bounce, and a third undetermined controller state induced by ground bounce to a determined controller state, whereby transitioning the TAP controller to a determined controller state recovers the TAP controller from the ground bounce during the boundary scan test; and
    resuming the boundary scan test when the TAP controller has been recovered from the ground bounce.

2. The method recited in claim 1, wherein the first, second, and third undetermined controller states are selected from the group of states consisting of an UPDATE state, a RUN-TEST/IDLE state, a SELECT-DR-SCAN state, and a CAPTURE-DR state.

3. The method recited in claim 1, wherein the first, second, and third undetermined controller states include an UPDATE state, a RUN-TEST/IDLE state, and a SELECT-DR-SCAN state.

4. The method recited in claim 1, wherein the determined controller state is an UPDATE-DR state.

5. The method recited in claim 1, wherein the TAP controller is further capable of being transitioned from a fourth undetermined controller state induced by ground bounce to the determined controller state, and wherein the first, second, third, and fourth undetermined controller states include an UPDATE state, a RUN-TEST/IDLE state, a SELECT-DR-SCAN state, and a CAPTURE-DR state.

6. The method recited in claim 1, wherein transitioning the TAP controller further comprises:
    providing a low Test Mode Select input to the TAP controller prior to a falling edge of a clock signal while in an UPDATE state.

7. The method recited in claim 6, wherein transitioning the TAP controller further comprises:
providing the TAP controller with a Test Mode Select input having the following bit pattern for a consecutive series of rising edges of clock signals: a plurality of lows, high, a plurality of lows, high, high.

8. The method recited in claim 6, wherein transitioning the TAP controller further comprises:
providing the TAP controller with a Test Mode Select input having the following bit pattern for a consecutive series of rising edges of clock signals: low, high, low, high, high.

9. An apparatus for conducting a boundary scan test, the apparatus comprising:
at least one Test Access Port (TAP) controller; and
means for transitioning the TAP controller when ground bounce occurs during a boundary scan test, the transitioning means configured to transition the TAP controller from first, second, and third undetermined controller states induced by ground bounce to a determined controller state to recover the TAP controller from the ground bounce, thereby allowing the boundary scan test to resume when the TAP controller is recovered from the ground bounce.

10. The apparatus recited in claim 9, wherein the transitioning means further comprises:
means for providing the TAP controller with a low Test Mode Select input prior to a falling edge of a clock signal while in an update state.

11. The apparatus recited in claim 10, wherein the determined controller state is an UPDATE-DR state.

12. The apparatus recited in claim 11, wherein the first, second, and third undetermined controller states are selected from the group of states consisting of an UPDATE state, a RUN-TEST/IDLE state, a SELECT-DR-SCAN state, and a CAPTURE-DR state.

13. The apparatus recited in claim 9, wherein the first, second, and third undetermined controller states include an UPDATE state, a RUN-TEST/IDLE state, and SELECT-DR-SCAN state.

14. The apparatus recited in claim 13, wherein the transitioning means further comprises:
means for providing the TAP controller with a Test Mode Select input having the following bit pattern for consecutive series of rising edges of clock signals: low, high, low, high, high.

15. The apparatus recited in claim 9, wherein the transitioning means is further configured to transition the TAP controller from a fourth undetermined controller state induced by ground bounce to the determined controller state, and wherein the first, second, third, and fourth controller states include an UPDATE state, a RUN-TEST/IDLE state, a SELECT-DR-SCAN state, and a CAPTURE-DR state.

16. The apparatus recited in claim 15, wherein the transitioning means further comprises:
means for providing the TAP controller with a Test Mode Select input having the following bit pattern for a consecutive series of rising edges of clock signals: a plurality of lows, high, a plurality of lows, high, high.

17. A testing circuit comprising:
first logic configured to provide a Test Access Port (TAP) controller with a low Test Mode Select input prior to a transition from an update state; and
second logic configured to transition the TAP controller when a ground bounce occurs during a boundary scan test, the second logic configured to transition the TAP controller from a first undetermined controller state induced by ground bounce, a second undetermined controller state induced by ground bounce, and a third undetermined controller state induced by ground bounce to a determined controller state to thereby recover the TAP controller from the ground bounce during the boundary scan test;
wherein the boundary scan test can be resumed when the TAP controller has been recovered from the ground bounce.

18. The testing circuit recited in claim 17, wherein the first logic is further configured to provided the TAP controller with a Test Mode Select input having the following bit pattern for a consecutive series of rising edges of clock signals: a plurality of lows, high, a plurality of lows, high, high.

19. The testing circuit recited in claim 17, wherein the TAP controller is one of a plurality of controllers in a boundary scan chain.

20. The testing circuit recited in claim 17, wherein the second logic is further configured to transition the TAP controller from a fourth undetermined controller state induced by ground bounce to the determined controller state, and wherein the first, second, third, and fourth undetermined controller states include an UPDATE state, a RUN-TEST/IDLE state, a SELECT-DR-SCAN state, and a CAPTURE-DR state.

21. The testing circuit recited in claim 20, wherein the first logic is further configured to provided the TAP controller with a Test Mode Select input having the following bit pattern for a consecutive series of rising edges of clock signals: a plurality of lows, high, a plurality of lows, high, high.

22. The testing circuit recited in claim 21, wherein the TAP controller is one of a plurality of controllers in a boundary scan chain.

23. The testing circuit recited in claim 17, wherein the second logic is further configured to operationally transition the TAP controller from an undetermined data state to a determined data state.

24. The testing circuit recited in claim 23, wherein the TAP controller is one of a plurality of controllers in a boundary scan chain.

25. The testing circuit recited in claim 23, wherein the second logic begins transitioning the TAP controller from the undetermined data state to the determined data state when the TAP controller has reached an UPDATE-DR state.

26. The testing circuit recited in claim 25, wherein the TAP controller is one of a plurality of controllers in a boundary scan chain.

* * * * *

UNITED STATES PATENT AND TRADEMARK OFFICE
CERTIFICATE OF CORRECTION

PATENT NO. : 7,107,503 B2
APPLICATION NO. : 10/078883
DATED : September 12, 2006
INVENTOR(S) : Balzer It is certified that error appears in the above-identified patent and that said Letters Patent is hereby corrected as shown below:

Column 11, line 29, in Claim 10, delete "update" and insert -- UPDATE --, therefor.

Column 12, line 4, in Claim 17, delete "update" and insert -- UPDATE --, therefor.

Signed and Sealed this

Twentieth Day of March, 2007

JON W. DUDAS
*Director of the United States Patent and Trademark Office*